US007457118B1

(12) United States Patent
French et al.

(10) Patent No.: US 7,457,118 B1
(45) Date of Patent: Nov. 25, 2008

(54) METHOD AND APPARATUS FOR DISPERSING HEAT FROM HIGH-POWER ELECTRONIC DEVICES

(75) Inventors: F. William French, Littleton, MA (US); Leonard A. Merrill, Millis, MA (US)

(73) Assignee: EMC Corporation, Hopkinton, MA (US)

( * ) Notice: Subject to any disclaimer, the term of this patent is extended or adjusted under 35 U.S.C. 154(b) by 187 days.

(21) Appl. No.: 10/740,990

(22) Filed: Dec. 19, 2003

(51) Int. Cl.
*H05K 7/20* (2006.01)
(52) U.S. Cl. .................... 361/700; 361/687; 361/701; 361/702; 361/703
(58) Field of Classification Search ......... 361/700–703, 361/687; 165/272–274; 257/714, 715
See application file for complete search history.

(56) References Cited

U.S. PATENT DOCUMENTS

| | | | | |
|---|---|---|---|---|
| 4,204,246 | A | * | 5/1980 | Arii et al. .................... 361/699 |
| 5,095,404 | A | * | 3/1992 | Chao .......................... 361/700 |
| 5,331,510 | A | * | 7/1994 | Ouchi et al. ................. 361/702 |
| 5,339,214 | A | * | 8/1994 | Nelson ........................ 361/695 |
| 5,946,191 | A | * | 8/1999 | Oyamada .................... 361/700 |
| 6,043,980 | A | * | 3/2000 | Katsui ........................ 361/695 |
| 6,104,611 | A | * | 8/2000 | Glover et al. ............... 361/700 |
| 6,229,704 | B1 | * | 5/2001 | Hoss et al. .................. 361/704 |
| 6,564,859 | B2 | * | 5/2003 | Reisfeld ................. 165/104.26 |
| 6,674,643 | B2 | * | 1/2004 | Centola et al. .............. 361/720 |
| 6,708,754 | B2 | * | 3/2004 | Wei .............................. 165/46 |
| 6,724,617 | B2 | * | 4/2004 | Amaike et al. .............. 361/683 |
| 6,802,362 | B2 | * | 10/2004 | Wenger et al. .............. 165/80.3 |
| 6,804,117 | B2 | * | 10/2004 | Phillips et al. .............. 361/700 |
| 6,828,675 | B2 | * | 12/2004 | Memory et al. ............. 257/714 |
| 6,909,608 | B2 | * | 6/2005 | Fan ............................. 361/700 |
| 6,966,363 | B2 | * | 11/2005 | Gailus et al. ................ 165/185 |

FOREIGN PATENT DOCUMENTS

| | | | | |
|---|---|---|---|---|
| JP | 03105955 | A | * | 5/1991 |
| JP | 04266091 | A | * | 9/1992 |
| JP | 05235573 | A | * | 9/1993 |

OTHER PUBLICATIONS

JP/05-235,573—machine translation of the Detailed Description of the Invention.*

* cited by examiner

*Primary Examiner*—Anatoly Vortman
(74) *Attorney, Agent, or Firm*—Krishnendu Gupta; Scott A. Ouellette

(57) ABSTRACT

A heat dissipation apparatus includes a heat absorption device coupled to a board, the heat absorption device configured to absorb heat generated by an electrical device mounted on the board, a heat dispersion device configured discretely from the heat absorbing device and the board for dispersing heat input thereto and a heat transporting device coupled between the heat absorption device and the heat dispersion device for transporting heat absorbed by the heat absorption device to the heat dispersion device.

24 Claims, 8 Drawing Sheets

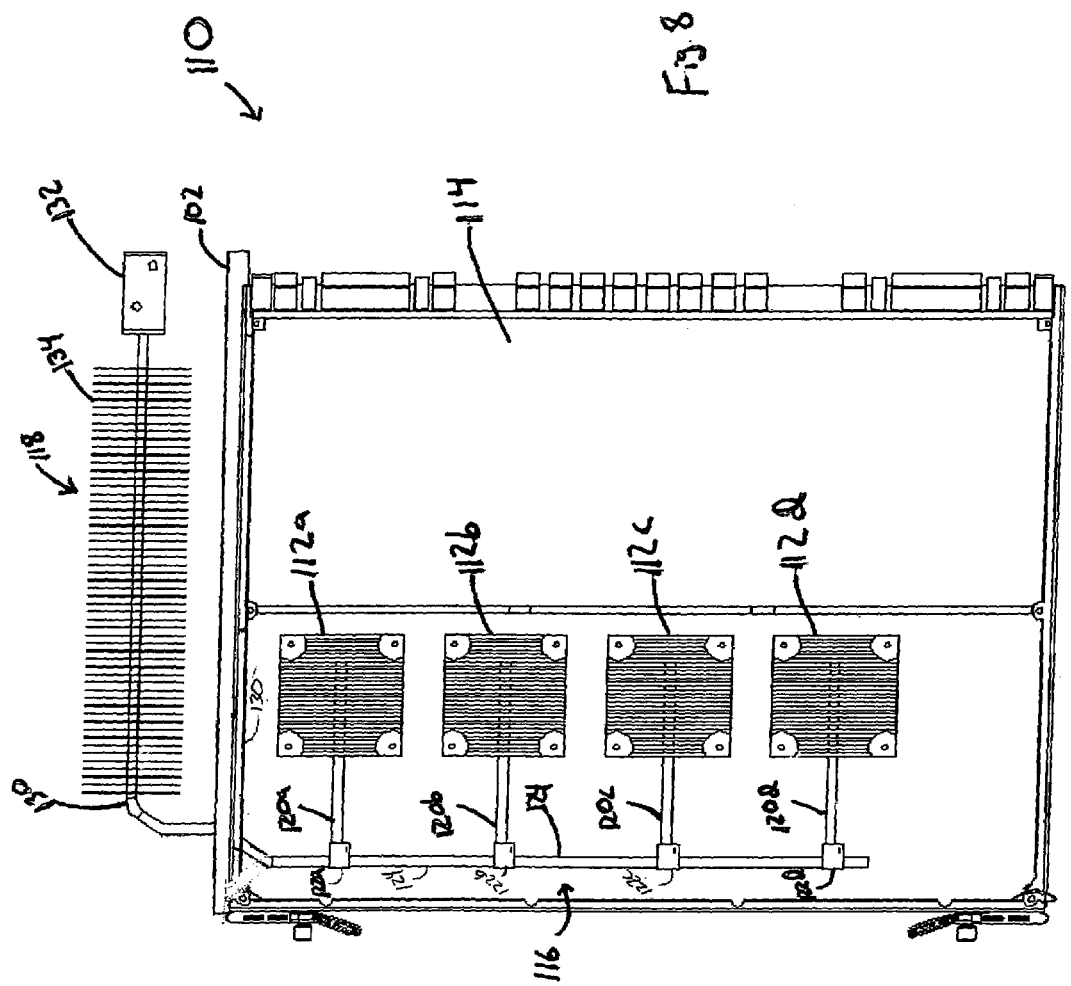

METHOD AND APPARATUS FOR DISPERSING HEAT FROM HIGH-POWER ELECTRONIC DEVICES

FIELD OF THE INVENTION

The present invention is directed generally to a method and apparatus for dispersing heat from high-power electronic devices and more particularly to a method and apparatus for transporting heat from high-power electronic devices to a radiator device for dispersion.

BACKGROUND OF THE INVENTION

As the power requirements for microprocessors increases due to increases in clock speeds and functionality, the amount of heat generated by the microprocessors also increases. The heat generated by the microprocessors must be removed from the location of the microprocessors in order for the microprocessors to function to their full potential. However, in systems that utilize multiple boards, each including multiple microprocessors, mounted within an enclosure that also houses electrical equipment such as disk drives and power supplies, prior art heat sinks are constrained to the available footprint size on the board and the distance or pitch between each board. As the power requirements of these microprocessors increases and the footprint size and board pitch decreases, prior art heat sinks are becoming less able to remove the heat generated by the microprocessors, thus impeding their performance.

SUMMARY OF THE INVENTION

The present invention is directed to a method and apparatus for dispersing heat from high-power electronic devices, preferably high-power electronic devices mounted on boards having minimized board pitches, where the space available for mounting adequate heat sinks to the boards is extremely limited or non-existent. The invention includes heat sinks mounted to the boards proximate the location of associated microprocessors, a heat pipe assembly configured to transport heat absorbed by the heat sinks away from the boards and a radiator device configured for dispersing the heat transported thereto by the heat pipe assembly from the heat sinks. The invention enables the increased amount of heat generated by the microprocessors to be moved away from the microprocessors and dispersed by the radiator device, which can be designed to be able to disperse an amount of heat that matches or exceed the amount of heat generated by the microprocessors.

According to one aspect of the invention, the heat dissipation apparatus includes a heat absorption device coupled to a board, the heat absorption device configured to absorb heat generated by an electrical device mounted on the board, a heat dispersion device configured discretely from the heat absorbing device and the board for dispersing heat input thereto and a heat transporting device coupled between the heat absorption device and the heat dispersion device for transporting heat absorbed by the heat absorption device to the heat dispersion device.

The heat dissipation device may further include a plurality of heat absorption devices coupled to the board, each of the plurality of heat absorption devices configured to absorb heat generated by an associated electrical device mounted on the board, and each of the plurality of heat absorption devices being coupled to the heat transporting device. The heat dissipation device may further include a second heat absorption device coupled to a second board, the second heat absorption device configured to absorb heat generated by an electrical device mounted on the second board, the second heat absorption device being coupled to the heat dispersion device through a second heat transporting device.

The heat transporting device may include a first heat transporting element extending from the heat absorption device and a second heat transporting element extending between the first heat transporting element and the heat dispersion device. The heat dispersion device may include a mount portion for coupling the heat dispersion device to the heat transporting device and a radiator device coupled to the mount portion for dispersing heat input to the heat dispersion device by the heat transporting device. The radiator device may include at least one heat transporting element extending from the mount portion of the heat dispersion device. The radiator device may further include at least one fin mounted on each of the at least one heat transporting elements. The first, second and third heat transporting elements may include heat pipes. The first heat transporting element, the second heat transporting element and the third heat transporting element may be in fluid communication with each other. The heat dissipation device may further include an enclosure, wherein the board is mounted to the enclosure in a first orientation and the heat dispersion device is mounted to the enclosure in a second orientation, the first orientation being non-parallel to the second orientation. A pitch between the first and second boards is at least 0.5". The first orientation of the board may be approximately perpendicular to the second orientation of the heat dispersion device.

The heat dissipation device may further include an enclosure, wherein the board is mountable within a slot formed in the enclosure by fitting first and second edges of the board into the slot formed in the enclosure; the slot is formed from a heat absorbing material; the heat transporting device comprises a first heat transporting element extending from the heat absorption device to the first edge of the board and the heat dispersion device includes a radiator device coupled to the slot of the enclosure. The first heat transporting element transfers heat absorbed by the heat absorption device to the slot, which transfers the heat off of the board to the radiator device of the heat dispersion device.

According to yet another embodiment, a method of dispersing heat from an electrical device, includes:

A) absorbing heat generated by an electrical device mounted on a board;

B) transporting the heat absorbed by the heat absorption device away from the electrical device and off of the board to a heat dispersion device configured discretely from the heat absorbing device and the board; and C) dispersing the heat input to the heat dispersion device.

BRIEF DESCRIPTION OF THE DRAWINGS

These and other features of the invention will become more readily apparent from the following detailed description when read together with the accompanying drawings, in which:

FIG. 8 is a side view of an alternative embodiment of the heat dispersion system in accordance with the present invention.

DETAILED DESCRIPTION

Figure 1:
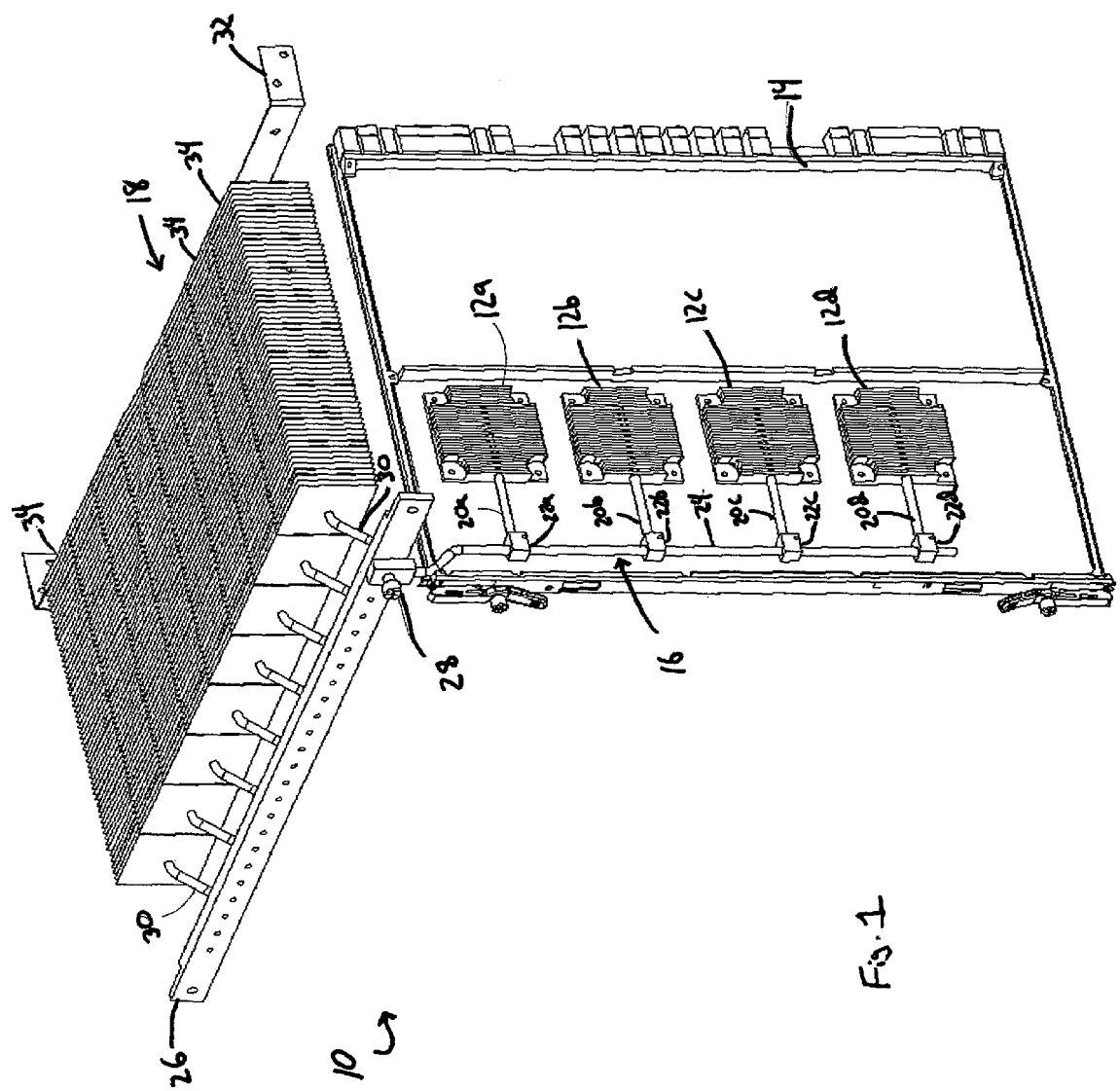
FIG. 1 is perspective view of a heat dispersion system in accordance with the present invention.
Figure 2:
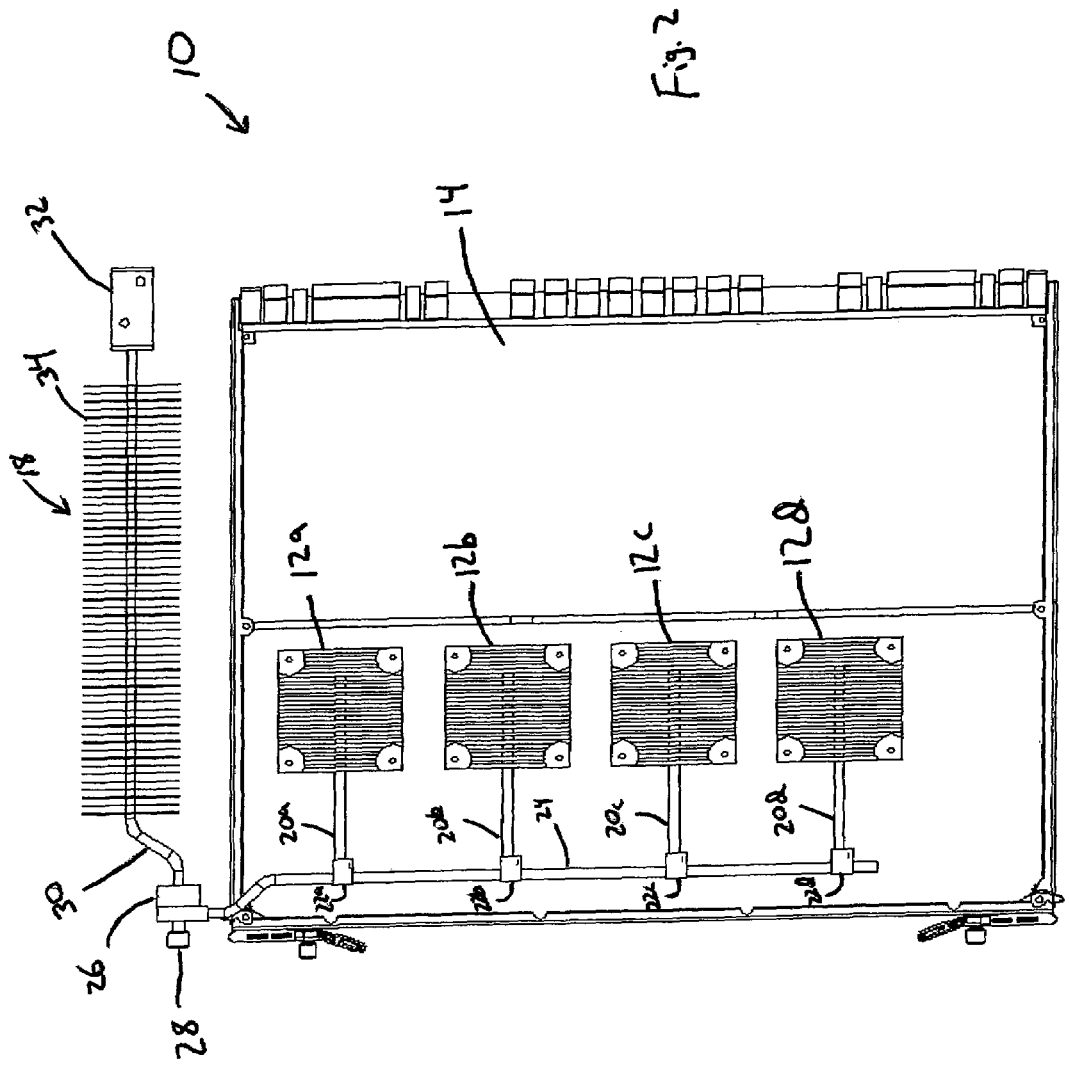
FIG. 2 is a side view of the heat dispersion system shown in FIG. 1 in accordance with the present invention.

Shown in FIGS. 1 and 2, which are perspective and side views, respectively, is a heat dissipation device 10 in accordance with a preferred embodiment of the present invention. Heat dissipation device 10 includes heat sinks 12a-12d mounted on a board 14 on which is mounted microprocessors and other electrical components (not shown) which are used to control the operation of other devices, such as disk drives. Each of the heat sinks 12a-12d preferably includes a finned extruded body of a metal, such as aluminum, copper or magnesium, mounted on the board 14 in contact with an upper surface of a microprocessor, which are not shown in FIG. 1, as they are located under the heat sinks 12a-12d. Heat sinks 12a-12d operate to absorb heat generated by the associated microprocessors during their operation. While this description and the figures describe the invention as having four heat sinks, each associated with a microprocessor, it will be understood that any number of heat sinks may be used in the invention to absorb heat generated by any type of heat generating device mounted on the board.

Figure 6:
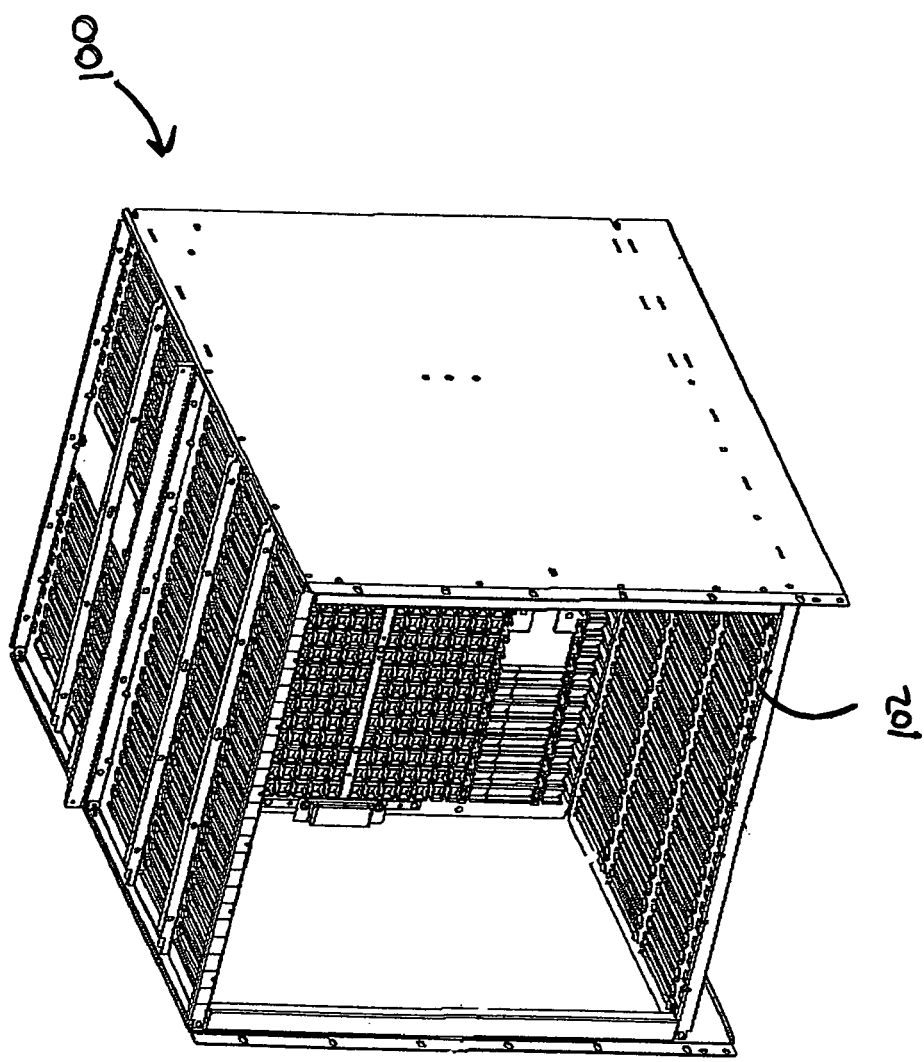
FIG. 6 is a perspective view of an enclosure into which the heat dispersion of the present invention may be mounted.

Typically, the board 14 is mounted within an enclosure such as that shown at 100, FIG. 6. The board 14 is mounted in slots 102 of the enclosure 100, and, as described below, a plurality of boards may be mounted in slots 102 of enclosure 100. In such a configuration, the board 14 may be utilized for controlling communications between microprocessors and a bank of disk drives (not shown). Preferably, fans are mounted above the enclosure 100 for the purpose of providing forced convection parallel to the boards. However, it will be understood that the fans could be mounted below the enclosure or between the boards and the radiator device 18. The radiator device 18 is preferably mounted in the enclosure in a perpendicular relationship with respect to the boards and the flow of air from the fans. This perpendicular orientation maximizes the heat dissipation capabilities of the radiator device by placing the greatest cross-section of the radiator device in the direct flow of the fans.

As shown in FIGS. 1 and 2, a heat transporting device 16 couples the heat sinks 12a-12d to the radiator device 18. Heat transporting device 16 includes heat transport elements 20a-20d which are embedded within each of the heat sinks 12a-12d, respectively, and extend from the associated heat sink 12a-12d to a coupling 22a-22d, respectively. Each element 20a-20d is coupled to element 24 of heat transporting device 16 by its associated coupling 22a-22d. Each of couplings 22a-22d preferably are formed from a heat absorbing material, such as aluminum, copper or magnesium, and are friction fit or clamped to both its associated heat transport element 20a-20d and the element 24. Element 24 couples each of the heat transport elements 20a-20d and consequently each heat sink 12a-12d, to a mount 26 of the radiator device 18.

As described above, the enclosure 100 is capable of housing a number of boards 14. Multiple boards may be used to provide access to multiple processors, which enables the overall system to access and control a greater number of disk drives or other electrical devices. Enclosure 100 provides a connection point between the boards 14 and the processors and disk drives associated with the overall system. Accordingly, enclosure 100 is designed to enable the easy installment and removal of the boards for the purposes of maintenance, upgrading, etc. Since the radiator device 16 is mounted to the enclosure 100, when boards 14 are installed or removed from the enclosure 100, the connection between the heat transporting device 16 and the radiator device 18 must be easy to engage and disengage.

In the preferred embodiment, element 24 of heat transporting device 16 is coupled to the mount 26 of the radiator device by a locking fitting 28, which may include a threaded attachment coupling, a latch, or any other suitable connection device that provide a secure, but releasable, connection between the heat transporting device 16 and radiator device 18 and which enables heat to be efficiently transferred from the heat transporting device 16 to radiator device 18.

Radiator device 18 includes a number of heat transport elements 30, which extend between mount 26 and a bracket 32, which is used, along with mount 26, to attach the radiator device 18 to the enclosure 100. Each element 30 is embedded within a fin stack 34, which provides increased surface area for heat transferred from the heat transporting device 16 to radiator device 18 to be dispersed via natural or forced convection.

Heat transport elements 20a-20d, 24 and 30 preferably comprise heat pipes, which are two-phase heat transfer devices that have an extremely high effective thermal conductivity. The construction and operation of heat pipes are known in the art. Generally, a typical heat pipe has an inner surface that is lines with a capillary wicking material. The heat pipe is filled with a working fluid, such as water, acetone or methanol. In the case of water, it is preferred that a non-electrically conductive form of water be used, such as deionized water. Heat is absorbed in an evaporator region of the heat pipe by vaporizing the working fluid. The vapor transports the heat to a condenser region, where the vapor condenses, releasing the heat. The condensed working fluid is pumped back to the evaporator region by gravity or capillary action.

In the preferred embodiment, for ease of manufacture, the heat transport elements 20a-20d, 24 and 30 are discrete, self contained heat pipes that transfer heat to each other by absorbing heat that the upstream heat pipe releases. However, it will be understood that (1) heat transport elements 20a-20d, 24 and 30 could be formed as a single, continuous heat pipe; (2) heat transport elements 20a-20d and heat transport element 24 could be formed as a single, continuous heat pipe; or (3) heat transport element 24 and heat transport elements 30 could be formed as a single, continuous heat pipe. In the first and second cases, a single, continuous heat pipe could be formed that begins at the heat sink furthest away from the mount 26 and loops through each of the heat sinks on its way to the attachment point between the heat transporting device and the radiator device. In the first and third cases, a fitting 28 that enables the fluid within the heat pipes to flow between heat transport elements 24 and 30, through mount 26, would be required.

Figure 7:
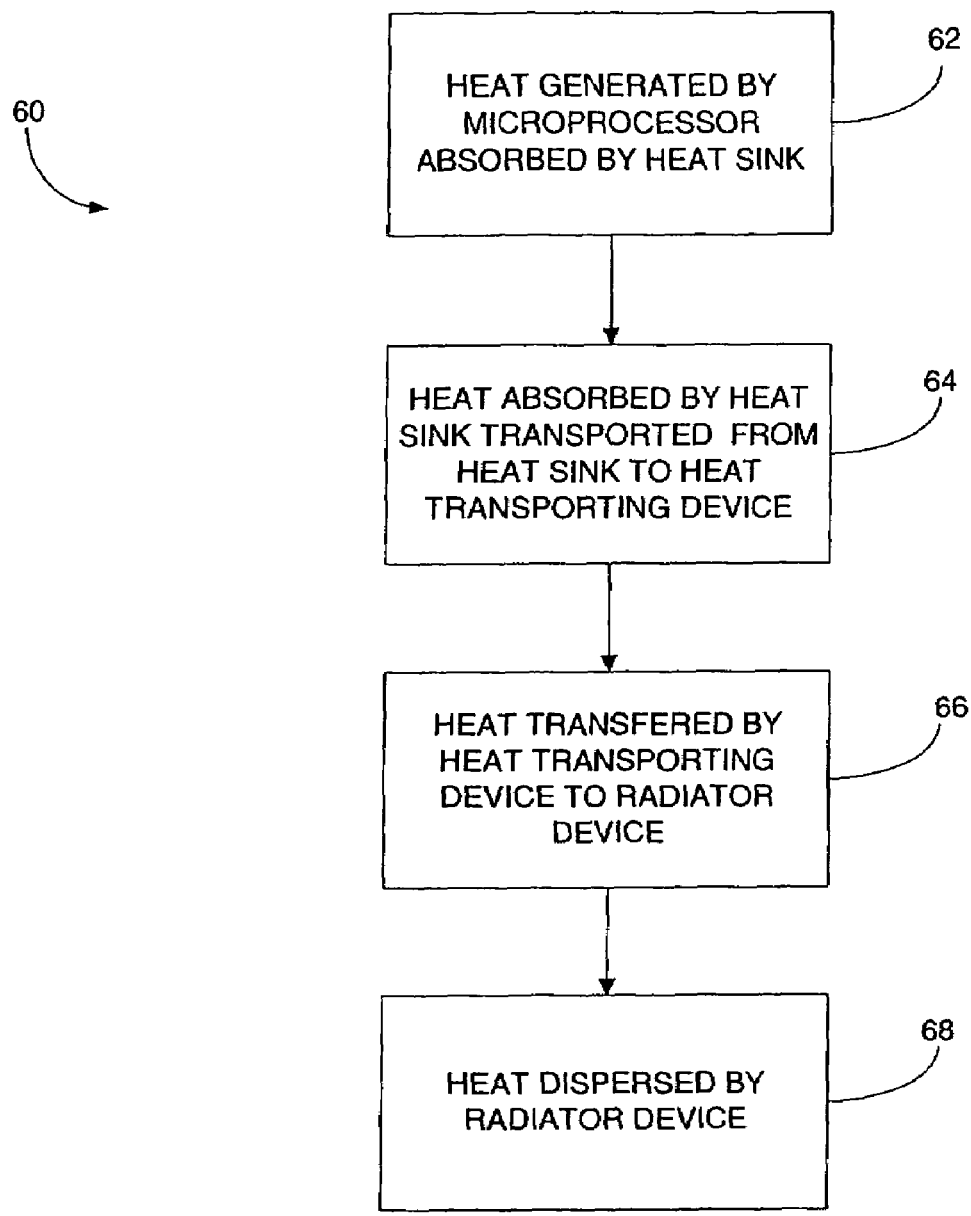
FIG. 7 is a flow diagram showing the steps involved in the operation of the heat dispersion system in accordance with the present invention.

In operation, as illustrated in flow diagram 60, FIG. 7, heat generated by a microprocessor mounted on the board 14 is absorbed by its associated heat sink 12a-12d, Step 62. For the purpose of this example, the microprocessor is associated with heat sink 12d. As the heat sink 12d absorbs the heat generated by the microprocessor, it is transported away from the heat sink 12d by the heat transporting device 16, Step 64. In particular, the heat is transported through heat transport element 20d of heat transporting device 16 to heat transport element 24 of heat transporting device 16 through coupling 22d. The heat is transferred by the heat transporting device 16 to the radiator device 18, Step 66. The heat is received by the radiator device through locking fitting 28 and mount 26 into one or more heat transport elements 30, where it is transferred to fin stacks 34 and dispersed into the ambient air, Step 68. In the preferred embodiment, the dispersion of heat by the radiator device 18 is aided through the use of fans that provide forced convection. However, it will be understood that the dispersion may also take place through natural convection.

Figure 3:
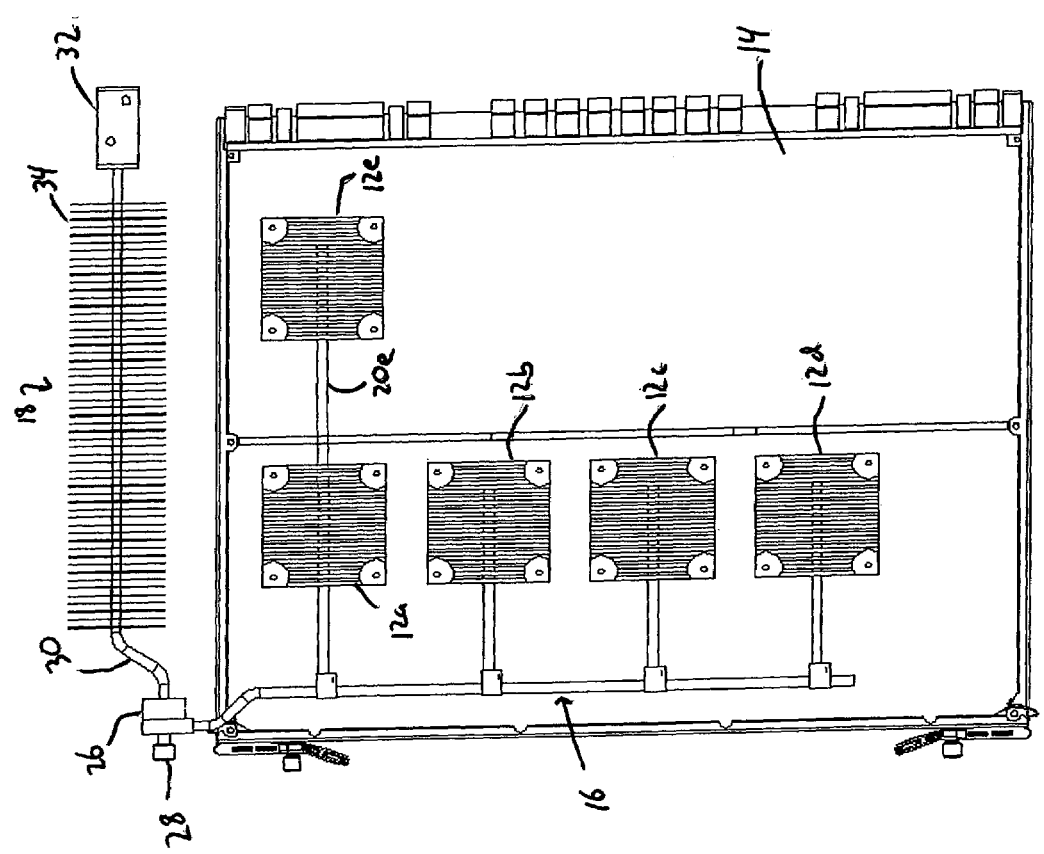
FIG. 3 is a side view of and alternative embodiment of the heat dispersion system in accordance with the present invention.

An alternative embodiment of the invention is shown at 36, FIG. 3. In this embodiment, an additional heat sink 12e is serially connected to element 20a embedded in heat sink 12a through its own element 20e which is embedded in heat sink 12e. Heat absorbed by the heat sink 12e is transported to element 24 of heat transporting device 16 through both element 12e and element 12a. The heat absorbed in heat sink 12e is then transported to radiator device 18 in the manner described above.

Figure 4:
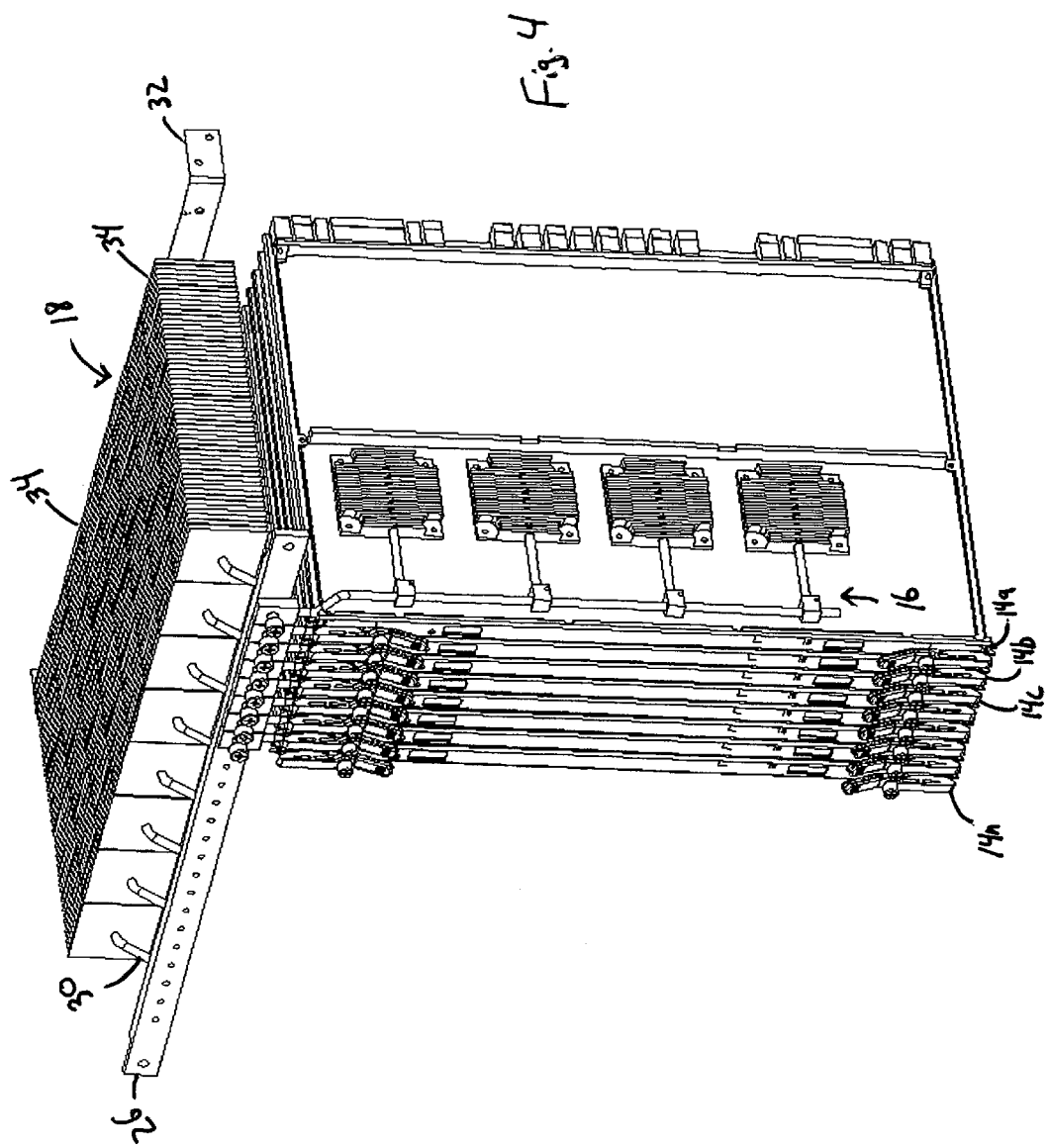
FIG. 4 is perspective view of the heat dispersion system, including multiple boards mounted to the radiator device of the heat dispersion system in accordance with the present invention.
Figure 5:
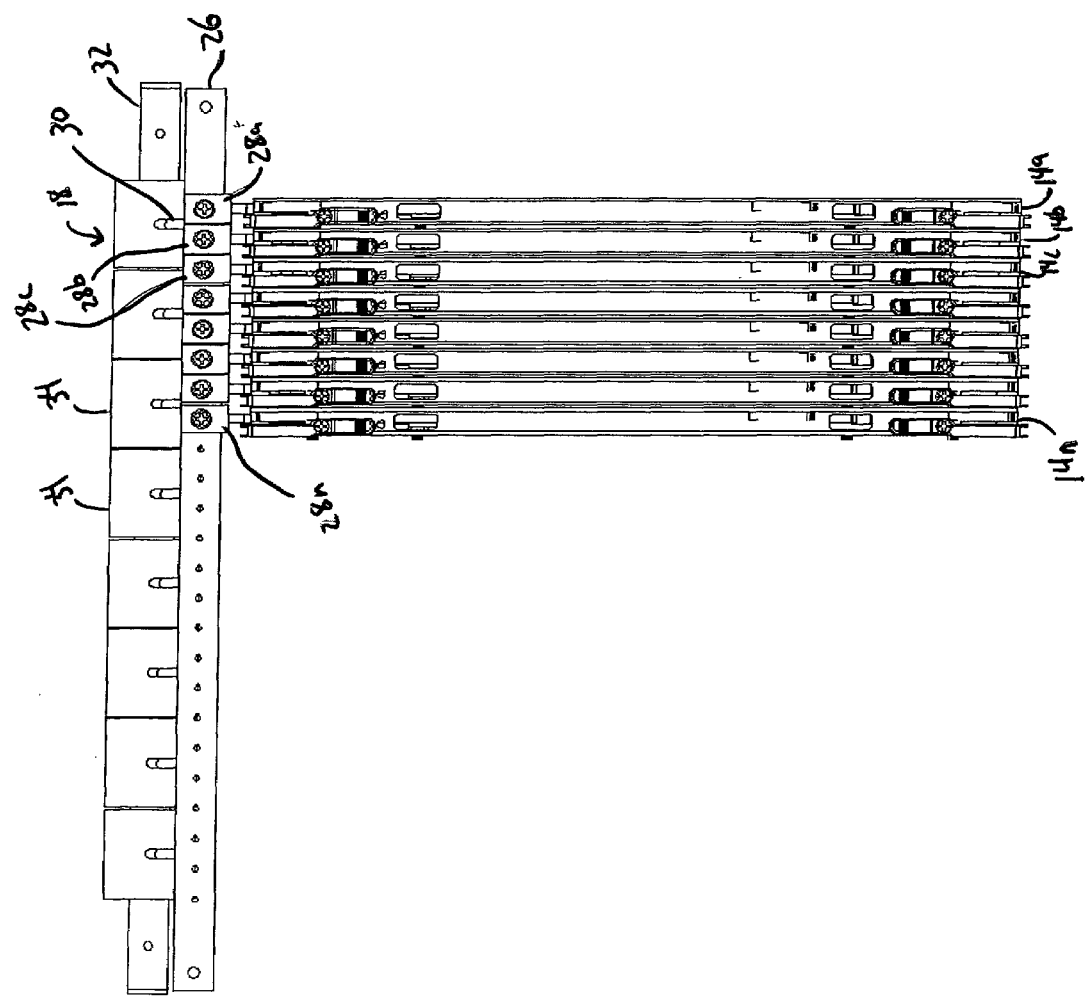
FIG. 5 is a front view of the heat dispersion system shown in FIG. 4 in accordance with the present invention.

FIGS. 4 and 5 show a perspective and front view, respectively, of the present invention in which a plurality of boards is coupled to radiator device 18. As shown in FIGS. 4 and 5, boards 14a, 14b, 14c . . . 14n are coupled to mount 26 of the radiator device. Although not shown in FIGS. 4 and 5, these boards would be mounted in slots 102 of the enclosure 100. Each of the boards 14a, 14b, 14c . . . 14n are coupled to the mount 26 via its locking fitting 28a, 28b, 28c . . . 28n, respectively. Although only shown on board 14a, each board includes heat sinks and an associated heat transporting device 16 for transporting heat from the associated heat sinks to the radiator device 18.

As can be seen in FIGS. 4 and 5, the boards 14a, 14b, 14c . . . 14n are mounted very closely together in order to increase the number of boards that can be mounted in a single enclosure. In the preferred embodiment, the distance between the boards, or the board pitch, is in the range of at least 0.5" to 3.0". The configuration of the heat sinks and heat transporting device of the present invention is such that it does not increase the thickness of the board and therefore does not increase the board pitch. Accordingly, the enclosure into which the boards are mounted need not be reconfigured to accept boards that utilize the heat dissipation device of the present invention.

In an alternative embodiment, shown at 110 in FIG. 8 the heat transporting device 116 includes a heat transport element 130, such as a heat pipe, built into the top edge of the board 114 such that it directly contacts the slot 102 of the enclosure. For simplicity, only the slot 102 is shown in FIG. 8. In this embodiment, the slots 102 preferably are formed from a heat absorbing material, such as aluminum, copper or magnesium. The heat transport element 130 of radiator device 118 is mounted to the enclosure 100 in contact with the slots 102. Heat transport elements 120a-120d transport heat to heat transport element 124, which transports the heat to the heat transport element 130 built into the edge of the board. The heat is then transferred across the slots to the heat transport element 130 of radiator device 18. The heat is then dispersed by the radiator device 18. This embodiment enables the boards 14 to be installed into and removed from the enclosure 100 without any additional connections between the heat transporting device 16 and the radiator device 18.

Accordingly, the present invention provides a heat dissipation device that is capable of removing the increased amounts of heat generated by high-powered electrical devices. The heat dissipation device provides increased heat dispersion capabilities by transporting the heat away from the electrical devices to a discrete radiator device, which provides increased surface area, thus enabling the device to disperse heat more quickly and efficiently than prior art devices.

The invention may be embodied in other specific forms without departing from the spirit or essential characteristics thereof. For example, while in the preferred embodiment, the heat transporting elements are described as comprising heat pipes, it will be understood that any type of system that can efficiently and effectively transport heat from the heat sinks to the radiator device may be utilized. For example, the heat transporting elements may include a fluid cooling system which circulates a fluid, such as water, through each of the heat sinks and the radiator device. The fluid absorbs heat as it passes through the heat sinks and transports it to the radiator device, where the heat is dispersed. The cooled liquid is circulated back to the heat sinks via a separate return route, such that the entire system is a loop that continuously circulates the fluid to transport the heat generated by the processors and absorbed by the heat sinks away from the board to be dispersed through the radiator device. Furthermore, it will be understood that the invention may be utilized in any type of electrical system where increased heat dissipation is needed to remove heat generated by high-power devices. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

The invention claimed is:

1. A heat dissipation apparatus comprising:
   a first heat absorption device coupled to a first board, the first heat absorption device configured to absorb heat generated by an electrical device mounted on the first board;
   a second heat absorption device coupled to a second board, the second heat absorption device configured to absorb heat generated by an electrical device mounted on the second board;
   a heat dispersion device configured discretely from the heat absorbing device and the board for dispersing heat input thereto;
   a mount coupled to the heat dispersion device;
   a first heat transporting device coupled between the first heat absorption device and the mount for transporting heat absorbed by the first heat absorption device to the mount, and inputting the heat absorbed by the first heat absorption device to the heat dispersion device through the mount; and
   a second heat transporting device coupled between the second heat absorption device and the mount for transporting heat absorbed by the second heat absorption device to the mount, and inputting the heat absorbed by the heat absorption device to the heat dispersion device through the mount;
   each of the first and second heat transporting devices being securable to the mount by a locking device.

2. The heat dissipation device of claim 1 further comprising a plurality of heat absorption devices coupled to the board, each of the plurality of heat absorption devices configured to absorb heat generated by an associated electrical device mounted on the board, and each of the plurality of heat absorption devices being coupled to the heat transporting device.

3. The heat dissipation device of claim 1 wherein the heat transporting device comprises a first heat transporting element extending from the heat absorption device and a second heat transporting element extending between the first heat transporting element and the heat dispersion device.

4. The heat dissipation device of claim 2 wherein the heat transporting device comprises a first heat transporting element extending from each of the heat absorption devices and a second heat transporting element extending between each of the first heat transporting elements and the heat dispersion device.

5. The heat dissipation device of claim 1 wherein each heat transporting device comprises a first heat transporting element extending from each heat absorption device and a second heat transporting element extending between the first heat transporting element associated therewith and the heat dispersion device.

6. The heat dissipation device of claim 1 wherein the heat dispersion device comprises a mount portion for coupling the heat dispersion device to the heat transporting device and a radiator device coupled to the mount portion for dispersing heat input to the heat dispersion device by the heat transporting device.

7. The heat dissipation device of claim 6 wherein the radiator device comprises at least one heat transporting element extending from the mount portion of the heat dispersion device.

8. The heat dissipation device of claim 7 wherein the radiator device further comprises at least one fin mounted on each of the at least one heat transporting elements.

9. The heat dissipation device of claim 3 wherein the heat dispersion device comprises a mount portion for coupling the heat dispersion device to the heat transporting device and a radiator device coupled to the mount portion for dispersing heat input to the heat dispersion device by the heat transporting device.

10. The heat dissipation device of claim 9 wherein the radiator device comprises at least one third heat transporting element extending from the mount portion of the heat dispersion device.

11. The heat dissipation device of claim 10 wherein the radiator device further comprises at least one fin mounted on each of the at least one third heat transporting element.

12. The heat dissipation device of claim 3 wherein the first and second heat transporting elements comprise heat pipes.

13. The heat dissipation device of claim 10 wherein the first, second and third heat transporting elements comprise heat pipes.

14. The heat dissipation device of claim 2 wherein the heat dispersion device comprises a mount portion for coupling the heat dispersion device to the heat transporting device and a radiator device coupled to the mount portion for dispersing heat input to the heat dispersion device by the heat transporting device.

15. The heat dissipation device of claim 14 wherein the radiator device comprises at least one heat transporting element extending from the mount portion of the heat dispersion device.

16. The heat dissipation device of claim 15 wherein the radiator device further comprises at least one fin mounted on each of the at least one heat transporting element.

17. The heat dissipation device of claim 1 wherein the heat dispersion device comprises a mount portion for coupling the heat dispersion device to the first and second heat transporting devices and a radiator device coupled to the mount portion for dispersing heat input to the heat dispersion device by the first and second heat transporting devices.

18. The heat dissipation device of claim 17 wherein the radiator device comprises at least one heat transporting element extending from the mount portion of the heat dispersion device.

19. The heat dissipation device of claim 18 wherein the radiator device further comprises at least one fin mounted on the heat transporting element.

20. The heat dissipation device of claim 1 further comprising an enclosure, wherein the board is mounted to the enclosure in a first orientation and the heat dispersion device is mounted to the enclosure in a second orientation, the first orientation being non-parallel to the second orientation.

21. The heat dissipation device of claim 1 further comprising an enclosure, wherein the first and second boards are mounted to the enclosure in a first orientation and the heat dispersion device is mounted to the enclosure in a second orientation, the first orientation being non-parallel to the second orientation.

22. The heat dissipation device of claim 21 wherein a pitch between the first and second boards is at least 0.5".

23. The heat dissipation device of claim 22 wherein the pitch between the first and second boards is approximately 0.8".

24. The heat dissipation device of claim 20 wherein the first orientation of the board is approximately perpendicular to the second orientation of the heat dispersion device.

* * * * *